United States Patent
Lee

(10) Patent No.: US 11,551,757 B2
(45) Date of Patent: Jan. 10, 2023

(54) MEMORY DEVICE AND OPERATING METHOD THEREOF

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/505,011

(22) Filed: Oct. 19, 2021

(65) Prior Publication Data

US 2022/0036952 A1 Feb. 3, 2022

Related U.S. Application Data

(63) Continuation of application No. 16/993,003, filed on Aug. 13, 2020, now Pat. No. 11,189,346.

(30) Foreign Application Priority Data

Mar. 6, 2020 (KR) ........................ 10-2020-0028561

(51) Int. Cl.
*G11C 16/10* (2006.01)
*G11C 16/04* (2006.01)
*G11C 16/30* (2006.01)
*G11C 16/08* (2006.01)

(52) U.S. Cl.
CPC .......... *G11C 16/0483* (2013.01); *G11C 16/10* (2013.01); *G11C 16/30* (2013.01); *G11C 16/08* (2013.01)

(58) Field of Classification Search
CPC ..................................................... G11C 16/10

USPC ........................................ 365/185.11, 189.05
See application file for complete search history.

(56) References Cited

U.S. PATENT DOCUMENTS

2012/0275223 A1* 11/2012 Baek ...................... G11C 16/10
365/185.11

FOREIGN PATENT DOCUMENTS

KR 1020180060370 A 6/2018
KR 1020190076483 A 7/2019

* cited by examiner

*Primary Examiner* — Jason Lappas
(74) *Attorney, Agent, or Firm* — William Park & Associates Ltd.

(57) ABSTRACT

There are provided a memory device and an operating method thereof. The memory device includes: sub-blocks divided with respect to a buffer page in which buffer cells are included; a voltage generator for, in a program operation of a selected sub-block among the sub-blocks, applying a first pass voltage to unselected word lines connected to the selected sub-block, and applying a second pass voltage lower than the first pass voltage to unselected word lines connected to an unselected sub-block; and a buffer line circuit for selectively turning on or turning off the buffer cells by selectively applying a turn-on voltage or a turn-off voltage to buffer lines connected to the buffer cells. A position of the buffer page is set as a default according to a physical structure of memory cells included in the sub-blocks, and is reset according to an electrical characteristic of the memory cells.

10 Claims, 17 Drawing Sheets

MEMORY DEVICE AND OPERATING METHOD THEREOF

CROSS-REFERENCE TO RELATED APPLICATION

The present application is a continuation application of U.S. patent application Ser. No. 16/993,003, filed on Aug. 13, 2020, and claims priority under 35 U.S.C. § 119(a) to Korean patent application number 10-2020-0028561, filed on Mar. 6, 2020, in the Korean Intellectual Property Office, the entire disclosure of which is incorporated herein by reference.

BACKGROUND

1. Technical Field

The present disclosure generally relates to a memory device and an operating method thereof, and more particularly, to a memory device in which at least one buffer cell is included in a string and an operating method of such a memory device.

2. Related Art

A memory device may store data or output stored data. For example, a memory device may be configured as a volatile memory device in which stored data is lost when a supply of power is interrupted, or be configured as a nonvolatile memory device in which stored data is retained even when the supply of power is interrupted. A memory device may include: a memory cell array configured to store data; a peripheral circuit configured to perform various operations, such as program, read, and erase operations; and control logic configured to control the peripheral circuit.

As a degree of integration of a memory device becomes greater, the size of memory cells in the memory device gradually becomes smaller; and the distance between the memory cells gradually becomes narrower. Therefore, the memory cells may operate with increased sensitivity to ambient electrical changes. For example, in a program operation, a program voltage is applied to a selected word line, and a pass voltage is applied to the other unselected word lines. Because the pass voltage is a voltage which should allow all the memory cells to be turned on, the pass voltage has a high level. Therefore, a threshold voltage of the unselected memory cells may be increased by the pass voltage in the program operation.

SUMMARY

In accordance with an aspect of the present disclosure, there is provided a memory device including: sub-blocks divided with respect to a buffer page in which buffer cells are included; a voltage generator configured to, in a program operation of a selected sub-block among the sub-blocks, apply a first pass voltage to unselected word lines connected to the selected sub-block, and apply a second pass voltage lower than the first pass voltage to unselected word lines connected to an unselected sub-block; and a buffer line circuit configured to selectively turn on or turn off the buffer cells by selectively applying a turn-on voltage or a turn-off voltage to buffer lines connected to the buffer cells, wherein a position of the buffer page is set as a default according to a physical structure of memory cells included in the sub-blocks, and is reset according to an electrical characteristic of the memory cells.

In accordance with another aspect of the present disclosure, there is provided a method for operating a memory device, the method including: setting an address of a buffer page according to a physical structure of strings included in a selected memory block; applying a program allow voltage through a bit line connected to a selected string among the strings, and applying a program inhibit voltage through a bit line connected to an unselected string among the strings; turning on a first buffer cell connected between memory cells of the selected string, and turning off a second buffer cell connected between memory cells of the unselected string; with respect to the first and second buffer cells, applying a first pass voltage to unselected word lines of a region in which a selected word line is included and applying a second pass voltage lower than the first pass voltage to unselected word lines of the other region; and when an electrical characteristic of the memory cells is changed, resetting the address of the buffer page according to the changed electrical characteristic.

In accordance with still another aspect of the present disclosure, there is provided a memory device including: a first select transistor and a first sub-block, which are sequentially stacked above a source line; buffer cells stacked above the first sub-block; and a second sub-block, a second select transistor, and a bit line, which are sequentially stacked above the buffer cells, wherein memory cells which are included in the first and second sub-blocks and are included in different strings are commonly connected to word lines, wherein gates of the buffer cells are connected to different buffer lines, wherein the buffer cells are configured to be selectively turned on or turned off according to a turn-on voltage or a turn-off voltage, which is applied to each of the buffer lines.

BRIEF DESCRIPTION OF THE DRAWINGS

Example embodiments are described hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Various embodiments are directed to a memory device capable of preventing a phenomenon in which unselected memory cells included in unselected strings are programmed in a program operation. Some embodiments are directed to an operating method of such a memory device.

Figure 1:
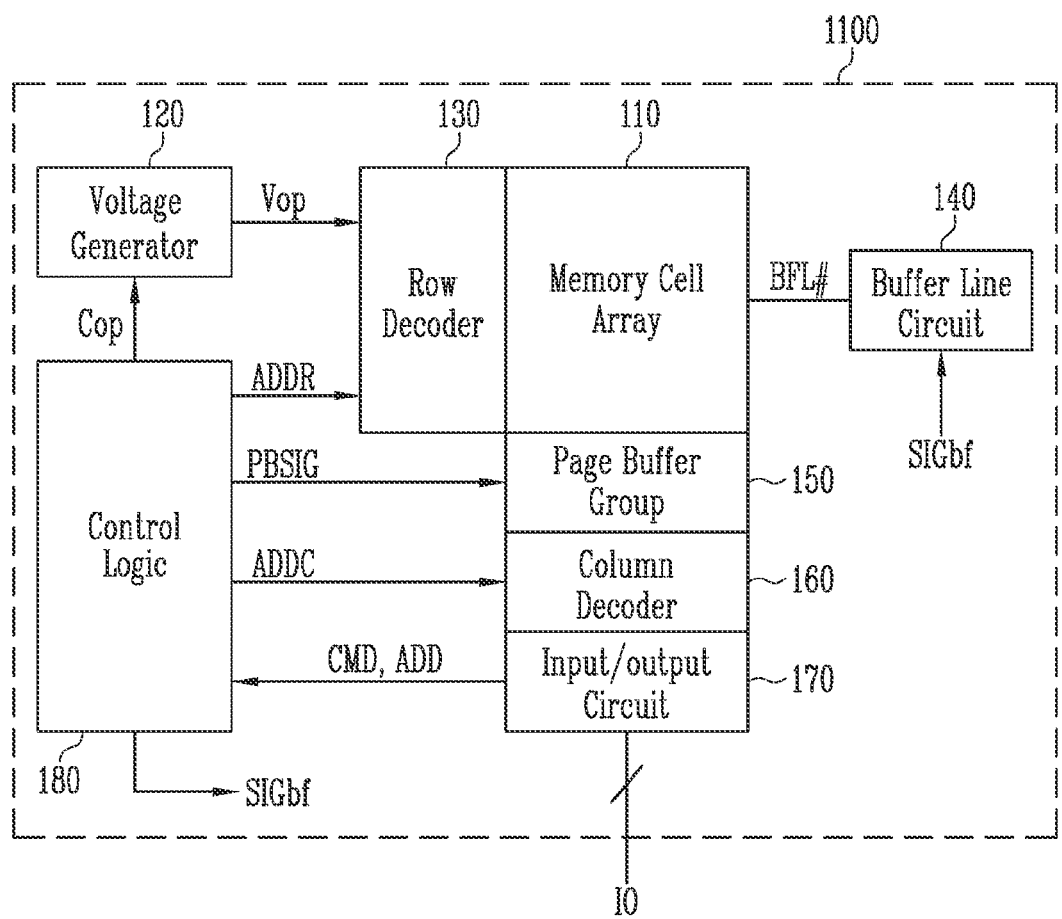
FIG. 1 is a diagram illustrating a memory device in accordance with an embodiment of the present disclosure.

FIG. 1 is a diagram illustrating a memory device 1100 in accordance with an embodiment of the present disclosure.

Referring to FIG. 1, the memory device 1100 may include: a memory cell array 110 configured to store data; peripheral circuits 120 to 170 configured to perform a program operation, a read operation, and an erase operation; and control logic 180 configured to control the peripheral circuits.

The memory cell array 110 may include a plurality of memory blocks, and each of the memory blocks may include a plurality of memory cells and a plurality of buffer cells. The memory cells may be implemented with a NAND flash memory cell, and the buffer cells may be formed in the same structure as the memory cells. The memory cells may store normal data, but the buffer cells may store dummy data to be used as switching elements. The memory cells may be connected to word lines, and the buffer cells may be connected to buffer lines.

The peripheral circuits 120 to 170 may include a voltage generator 120, a row decoder 130, a buffer line circuit 140, a page buffer group 150, a column decoder 160, and an input/output circuit 170.

The voltage generator 120 may generate and output operating voltages Vop necessary for a program, read or erase operation in response to an operation code Cop. For example, the operating voltages Vop may include a program voltage, a read voltage, an erase voltage, a pass voltage, and the like.

The row decoder 130 may transfer the operating voltage Vop to a selected memory block in response to a row address ADDR. For example, the row decoder 130 may transfer the operating voltages Vop to word lines, drain and source select lines, and a source line, which are connected to the selected memory block.

The buffer line circuit 140 may selectively apply a turn-on voltage or turn-off voltage to buffer lines BFL# connected to the selected memory block of the memory cell array in response to buffer signals SIGbf. For example, the buffer line circuit 140 may select lines to which the turn-on voltage is to be applied and lines to which the turn-off voltage is to be applied among the plurality of buffer lines BFLbf in response to the buffer signals SIGbf, and output the turn-on voltage or the turn-off voltage to the selected buffer lines BFL#. The page buffer group 150 may include a plurality of page buffers, and each of the page buffers may be connected to the memory block through a bit line. The page buffer group 150 may temporarily store data received from outside the memory device 1100 in a program operation, and temporarily store sensed data in a verify or read operation. The page buffer group 150 may temporarily store data or precharge bit lines with a positive voltage in response to page buffer signals PBSIGS, and sense a voltage or current of bit lines, which is changed depending on a threshold voltage of memory cells.

The column decoder 160 may transmit data between the input/output circuit 170 and the page buffer group 150 in response to a column address ADDC.

The input/output circuit 170 may receive a command CMD and an address ADD from an external device (e.g., a controller) through input/output lines IO, and input or output data. The input/output circuit 170 may transfer, to the control logic 180, the command CMD and the address ADD, which are input through the input/output lines IO.

The control logic 180 may control the peripheral circuits in response to the command CMD and the address ADD. The control logic 180 may output the operation code Cop, the page buffer signals PBSIGS, the row address ADDR, the column address ADDC, and the buffer signals SIGbf in response to the command CMD and the address ADD. The control logic 125 may be implemented as hardware, software, or a combination of hardware and software. For example, the control logic 125 may be a control logic circuit operating in accordance with an algorithm and/or a processor executing control logic code, FIG. 2 is a diagram illustrating the memory cell array 110 shown in FIG. 1.

Figure 2:
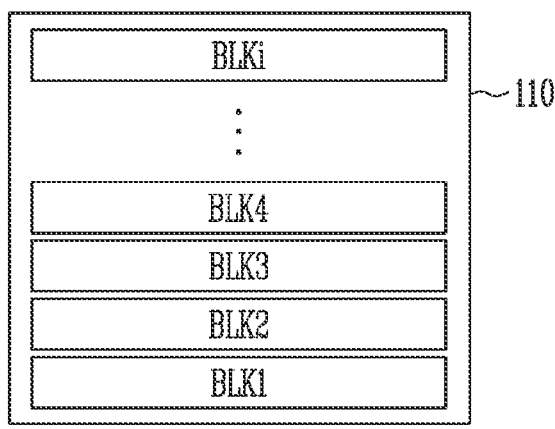
FIG. 2 is a diagram illustrating a memory cell array shown in FIG. 1.

Referring to FIG. 2, the memory cell array 110 may include first to ith memory blocks BLK1 to BLKi. In a single plane structure, the first to ith memory blocks BLK1 to BLKi constitute the memory cell array 110. However, in a multi-plane structure, the first to ith memory blocks BLK1 to BLKi may be included in one plane, and a plurality of planes may be included in the memory cell array 110, The first to ith memory blocks BLK1 to BLKi may be configured identically to one another, and therefore, the ith memory block BLKi among the first to ith memory blocks BLK1 to BLKi will be described in detail as follows, FIG. 3 is a diagram illustrating in detail the ith memory block BLKi in accordance with an embodiment of the present disclosure.

Figure 3:
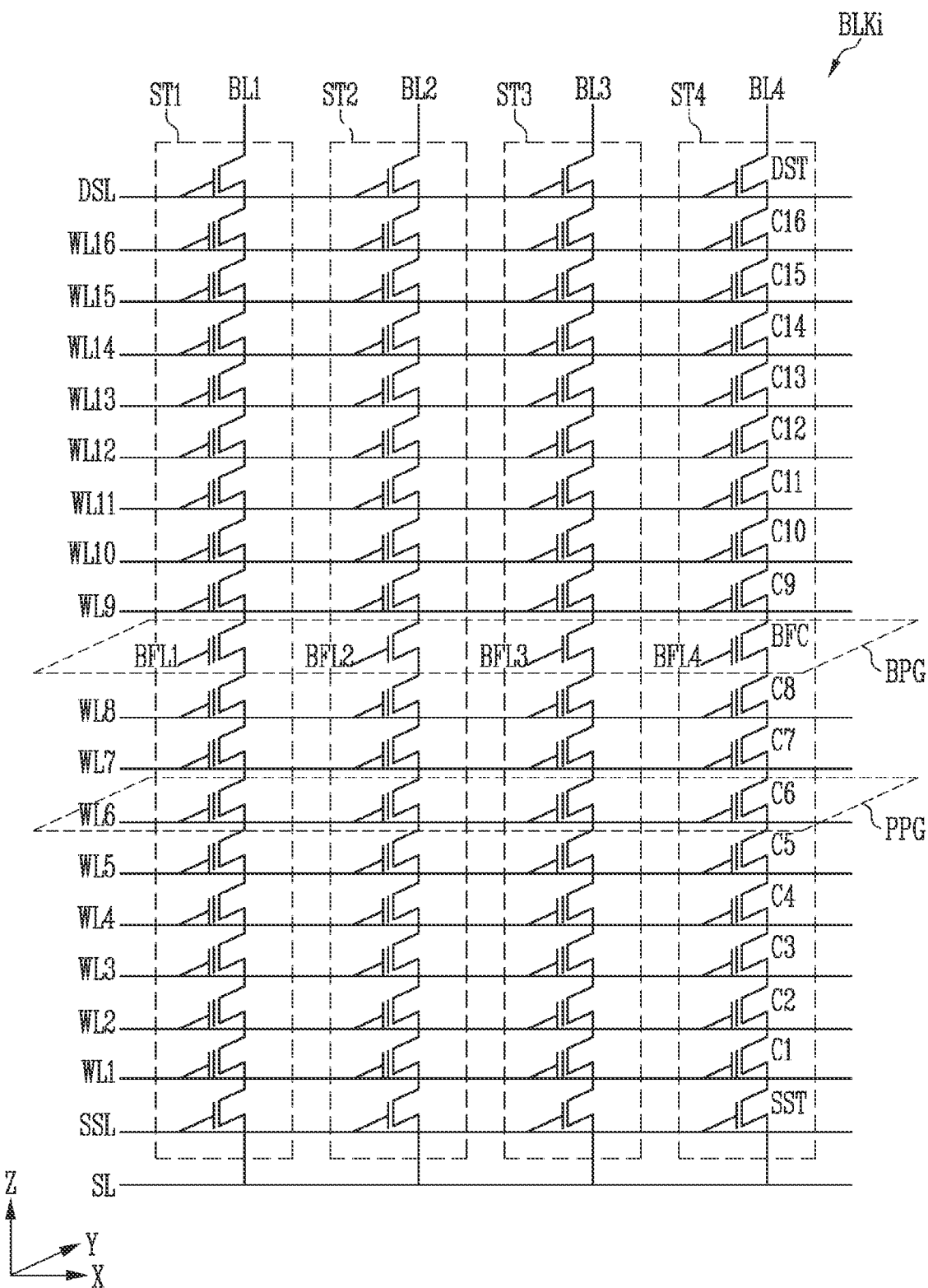
FIG. 3 is a diagram illustrating in detail an ith memory block in accordance with an embodiment of the present disclosure.

Referring to FIG. 3, the ith memory block BLKi may include a plurality of strings ST1 to ST4. Although FIG. 3 illustrates four strings ST1 to ST4, a greater number of strings may be included in the memory block BLKi.

The first to fourth strings ST1 to ST4 may be connected between bit lines BL1 to BL4 and a source line SL. For example, the first string ST1 may be connected to a first bit line BL1 and the source line SL, and the second string ST2 may be connected between a second bit line BL2 and the source line SL. Each of the first to fourth strings ST1 to ST4 may include a source select transistor SST, a plurality of memory cells C1 to C16, a drain select transistor DST, and at least one buffer cell BFC. The buffer cells BFC may be formed in the same structure as memory cells formed on the bottom or top thereof. For convenience of description, first to sixteenth memory cells C1 to C16 have been illustrated in FIG. 3. However, more than sixteen memory cells may be included in a string. The fourth string ST4 will be exemplified as follows.

The source select transistor SST included in the fourth string ST4 may electrically connect or disconnect the source line SL and the first memory cell C1 to or from each other according to a voltage applied to a source select line SSL. Gates of the first to sixteenth memory cells C1 to C16 may be connected to first to sixteenth word lines WL1 to WL16. The drain select transistor DST may electrically connect or disconnect a fourth bit line BL4 and the sixteenth memory cell C16 to or from each other according to a voltage applied to a drain select line DSL. Gates of the source select transistors SST included in the different strings ST1 to ST4 may be commonly connected to the source select line SSL, the gates of the first to sixteenth memory cells C1 to C16 may be connected to the first to sixteenth word lines WL1 to WL16, and gates of the drain select transistors DST included in the different strings ST1 to ST4 may be commonly connected to the drain select line DSL, A group of memory cells connected to the same word line may become a physical page PPG, and program and read operations may be performed in a unit of the physical page PPG.

The buffer cell BFC may be connected between the first to sixteenth memory cells C1 to C16. Although a case where the buffer cell BFC is connected between the eighth and ninth memory cells C8 and C9 has been illustrated in FIG. 3, the position of the buffer cell BFC may be changed depending on a region in which program disturb occurs. Gates of the buffer cells BFC included in the different strings ST1 to ST4 may be connected to different buffer lines BFL1 to BFL4. For example, the buffer cell included in the first string ST1 may be connected to a first buffer line BFL1, and the buffer cell BFC included in the second string ST2 may be connected to a second buffer line BFL2. Therefore, different voltages may be respectively applied to the different buffer lines BFL1 to BFL4, and hence the buffer cells BFC included in the different strings ST1 to ST4 may be turned on or turned off according to the respective voltages applied to the buffer lines BFL1 to BFL4. When the buffer cell BFC is turned on, a channel may be formed in the buffer cell BFC. When the buffer cell BFC is turned off, channels at both ends of the buffer cell BFC may be electrically disconnected from each other.

In order to perform a switching function, the buffer cells BFC may be programmed to have a constant threshold voltage before a normal program operation of a selected memory block is performed. For example, a program operation for increasing the threshold voltage of the buffer cells may be performed, after a block erase operation is performed.

The buffer cells BFC may all be turned on in read and erase operations, and be controlled in a program operation such that some of the buffer cells BFC are turned on and some of the buffer cells BFC are turned off. Accordingly, a method for controlling the buffer cells BFC in the program operation will be described.

Figure 4:
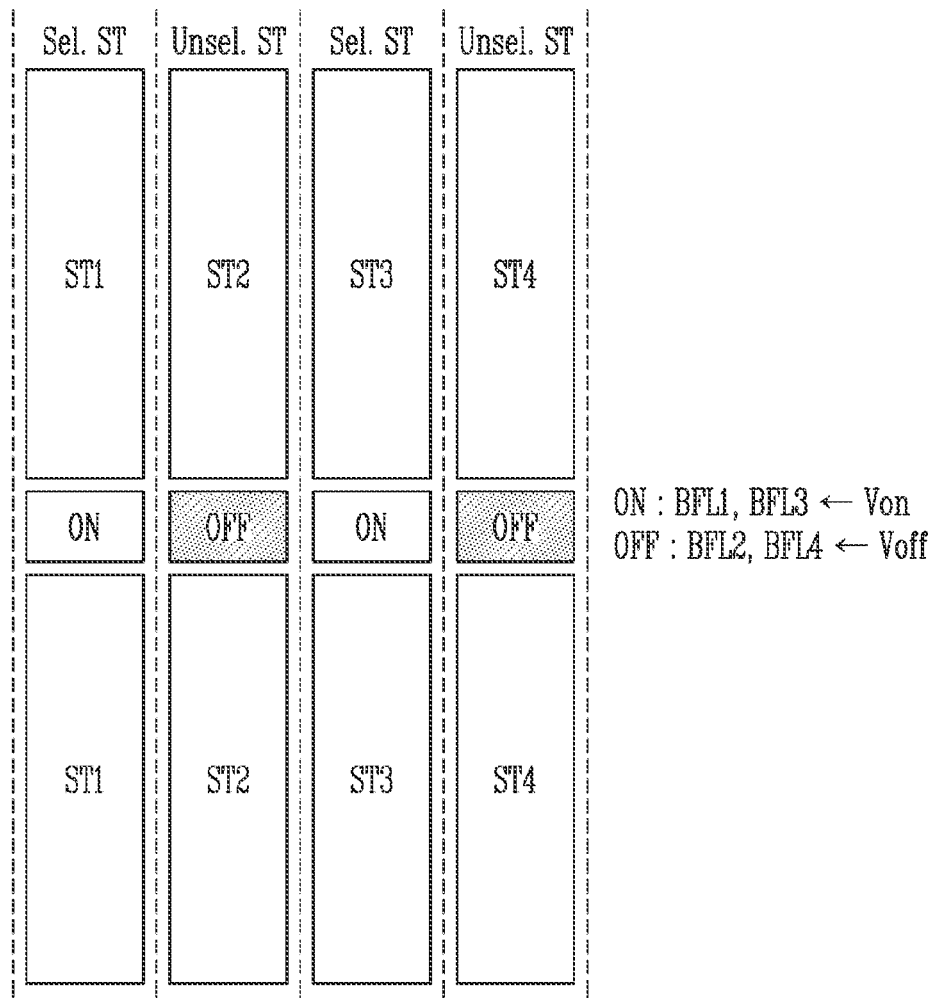
FIG. 4 is a diagram illustrating a driving method of buffer cells.

FIG. 4 is a diagram illustrating a driving method of buffer cells.

Referring to FIG. 4, in a program operation, strings ST may be divided into selected strings Sel. ST for programming data and unselected strings Unsel. ST which do not program the data. For example, there is assumed a case where, in the program operation, first and third strings ST1 and ST3 are the selected strings Sel. ST, and second and fourth strings ST2 and ST4 are the unselected strings Unsel. ST. A program allow voltage Val may be applied to first and third bit lines BL1 and BL3 connected to the selected strings Sel. ST, and a program inhibit voltage Vih may be applied to second and fourth bit lines BL2 and BL4 connected to the unselected strings Unsel, ST. For example, the program allow voltage Val may be 0V, and the program inhibit voltage Vih may be a positive voltage higher than 0V.

In order to turn on buffer cells BFC included in the selected strings Sel. ST, a turn-on voltage Von may be applied to first and third buffer lines BFL1 and BFL3. In order to turn off buffer cells BFC included in the unselected strings Unsel. ST, a turn-off voltage Voff may be applied to second and fourth buffer lines BFL2 and BFL4. The level of the turn-on voltage Von may be set as a level at which a channel can be formed in the buffer cells BFC. For example, the level of the turn-on voltage Von may be set as a level higher than a threshold voltage of the buffer cells BFC. The level of the turn-off voltage Voff may be set as a level at which the channel cannot be formed in the buffer cells BFC. For example, the level of the turn-off voltage Voff may be set to 0V lower than the threshold voltage of the buffer cells BFC.

When a pass voltage is applied to word lines commonly connected to the selected strings Sel. ST and the unselected strings Unsel. ST, a channel may be formed in the selected strings Sel. ST and the unselected strings Unsel. ST. Subsequently, when the buffer cells BFC included in the selected strings Sel. ST are turned on and the buffer cells BFC included in the unselected strings Unsel. ST are turned off, one channel is formed in the entire string in each of the selected strings Sel. ST, and a channel may be separated with respect to the buffer cells BFC in each of the unselected strings Unsel. ST. When the channel is separated as described above, a channel voltage may be increased in a region in which a selected word line is included with respect to the buffer cells BFC, and be decreased in a region in which the selected word line is not included. That is, the channel voltage is maintained at a required level, and the pass voltage applied to the unselected word lines is decreased, so that a phenomenon can be prevented, in which a threshold voltage of memory cells connected to the unselected word lines is increased by the pass voltage.

Figure 5:
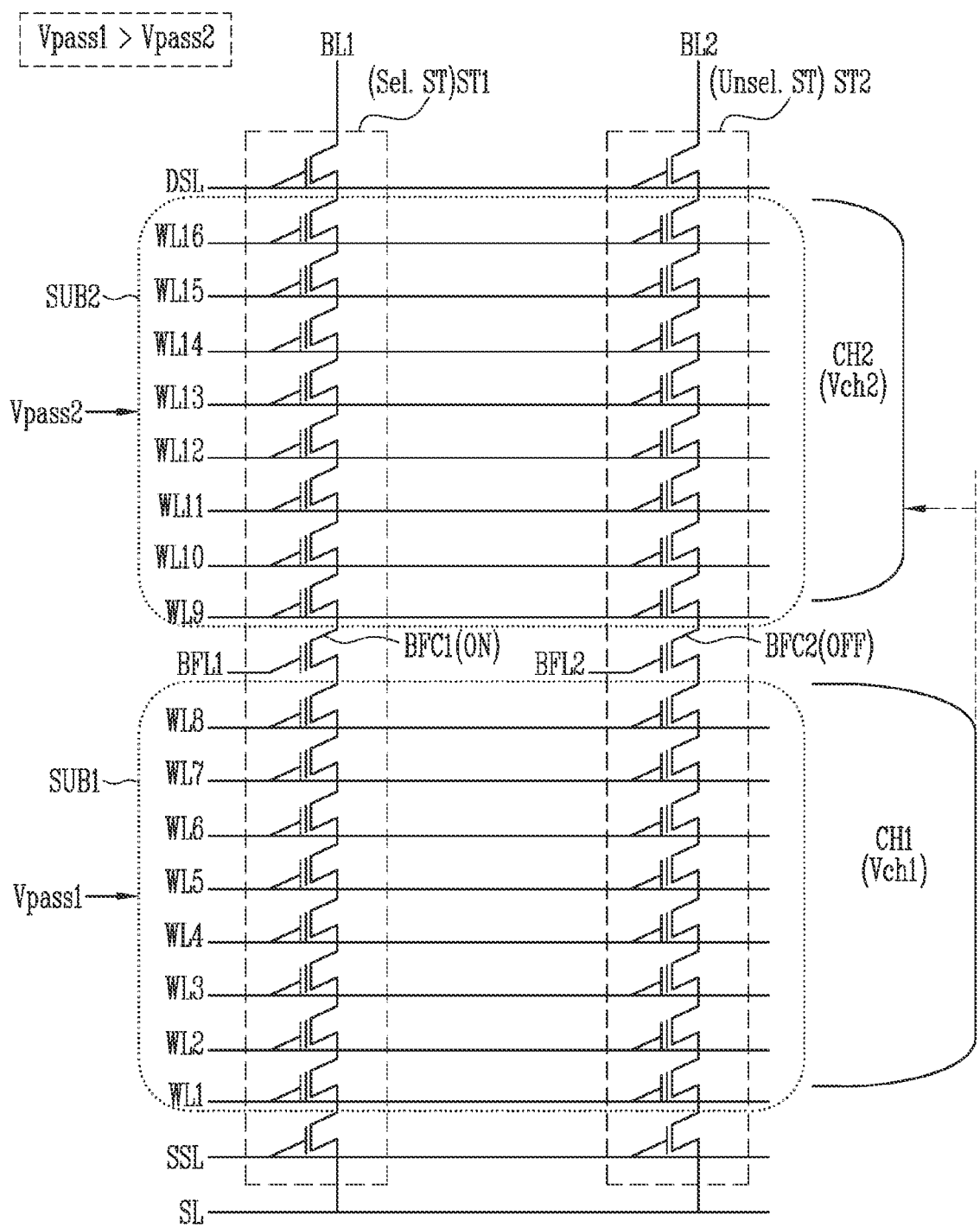
FIGS. 5 and 6 are diagrams illustrating channel voltages according to pass voltages.
Figure 6:
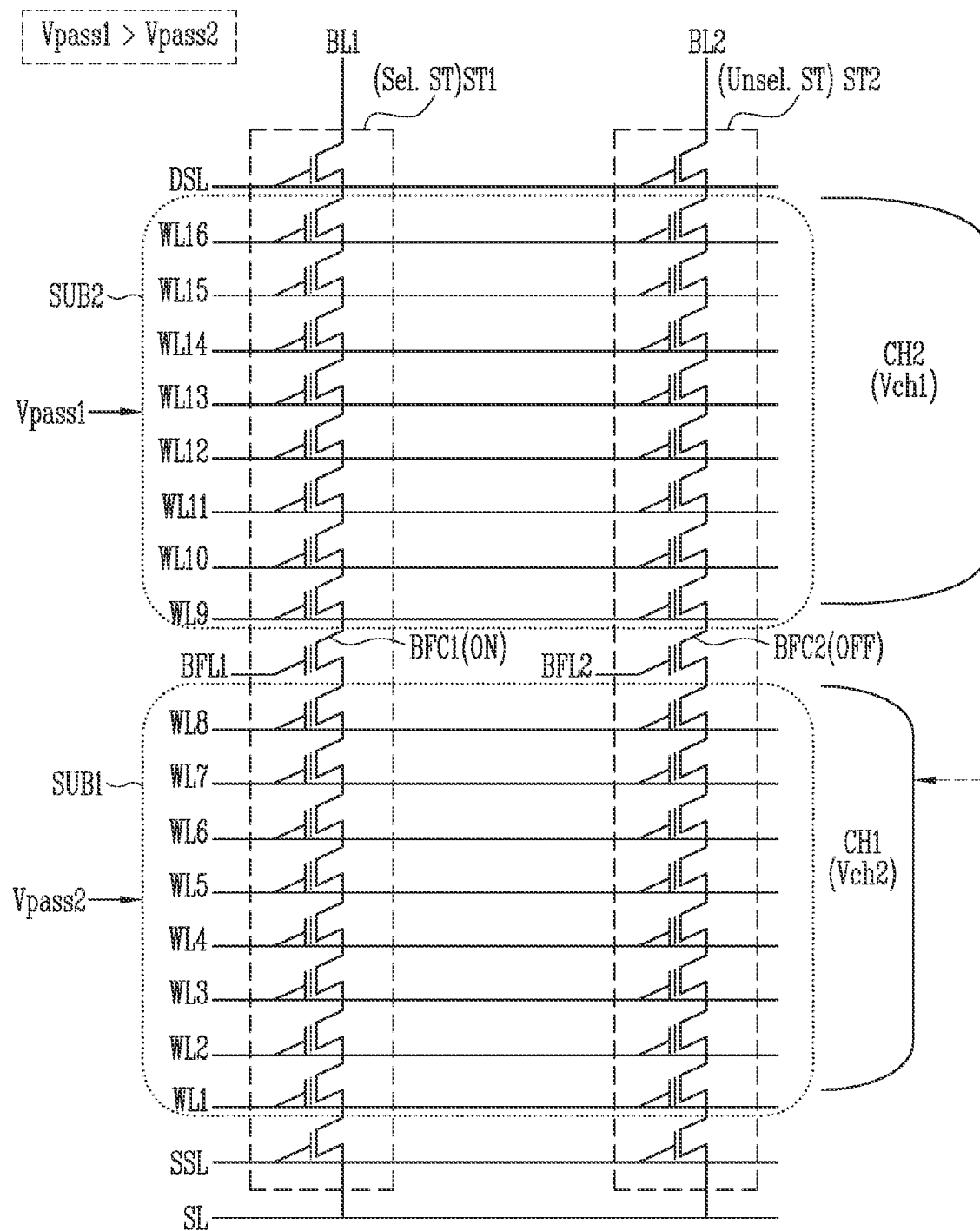

FIGS. 5 and 6 are diagrams illustrating channel voltages according to pass voltages.

Referring to FIG. 5, a memory block may be divided into a first sub-block SUB1 and a second sub-block SUB2 with respect to first and second buffer cells BFC1 and BFC2.

When a first string ST1 is a selected string Sel. ST and a second string ST2 is an unselected string Unsel. ST, a program allow voltage may be applied to a first bit line BL1, and a program inhibit voltage may be applied to a second bit line BL2. A turn-off voltage may be applied to a source select line SSL, and a turn-on voltage may be applied to a drain select line DSL. A first pass voltage Vpass1 may be applied to first to eighth word lines WL1 to WL8, and a second pass voltage Vpass2 lower than the first pass voltage Vpass1 may be applied to ninth to sixteenth word lines WL9 to WL16. The first and second pass voltages Vpass1 and Vpass2 may be set as positive voltages at which memory cells can be turned on. When the first and second pass voltages Vpass1 and Vpass2 are applied to the first to sixteenth word lines WL1 to WL16, a turn-on voltage as a positive voltage may be applied to first and second buffer lines BFL1 and BFL2. When the turn-on voltage is applied to the first and second buffer lines BFL1 and BFL2, the first and second buffer cells BFC1 and BFC2 may be turned on such that an initial channel is formed in the strings Sel. ST and Unsel. ST.

Because the program allow voltage is applied to the first bit line BL1, a channel voltage of the selected string Sel. ST becomes 0V, Because the program inhibit voltage as a positive voltage is applied to the second bit line BL2, a channel voltage of the unselected string Unsel. ST is increased to a positive voltage. When the channel voltage of the unselected string Unsel. ST is increased to the positive voltage, a drain select transistor DST included in the unselected string Unsel. ST may be turned off as a voltage difference between a source terminal and a drain terminal of the drain select transistor DST is decreased.

Subsequently, in order to turn off the second buffer cell BFC2 included in the unselected string Unsel. ST, a turn-off voltage may be applied to the second buffer line BFL2.

When the second buffer cell BFC2 is turned off, a channel of the second string ST2 may be separated with respect to the second buffer cell BFC2. When a channel between the second buffer cell BFC2 and a source select transistor SST is referred to as a first channel CH1 and a channel between the second buffer cell BFC2 and the drain select transistor DST is referred to as a second channel CH2, a voltage of the first channel CH1 may be increased to a first channel voltage Vch1 due to channel boosting caused by coupling with the first pass voltage Vpass1, and a voltage of the second channel CH2 may be increased to a second channel voltage Vch2 due to channel boosting caused by coupling with the second pass voltage Vpass2. Because the voltage of the second channel CH2 is increased to the second channel voltage Vch2 by the second pass voltage Vpass2, the second channel voltage Vch2 is lower than the first channel voltage Vch1. However, because both the second buffer cell BFC2 and the drain select transistor DST are turned off, the second channel voltage Vch2 may be continuously maintained.

As described above, the first and second channel voltages Vch1 and Vch2 of the unselected string Unsel. ST are maintained, and the second pass voltage Vpass having a low level is applied to unselected word lines connected to the selected string Sel. ST of the second sub-block SUB2, so that a phenomenon can be suppressed, in which a threshold voltage of unselected memory cells in the selected string Sel. ST is increased by the pass voltage.

Referring to FIG. 6, unlike FIG. 5, the first pass voltage Vpass1 may be applied to the word lines connected to the second sub-block SUB2, and the second pass voltage Vpass2 lower than the first pass voltage Vpass1 may be applied to the word lines connected to the first sub-block SUB1. The voltage of the first channel CH1 of the unselected string Unsel. ST may be increased to the second channel voltage Vch2 by the second pass voltage Vpass2, and the voltage of the second channel CH2 of the unselected string Unsel. ST may be increased to the first channel voltage Vch1 by the first pass voltage Vpass1. Although the voltage of the first channel CH1 of the unselected string Unsel. ST is increased to the second channel voltage Vch2, the second pass voltage Vpass2 lower than the first pass voltage Vpass1 is applied to the word lines connected to the first sub-block SUB1, and thus memory cells included in the first sub-block SUB1 can be less influenced by the pass voltage than when the first pass voltage Vpass1 is applied.

A program operation using the above-described pass voltage application method and the above-described buffer cell control method will be described in detail as follows.

Figure 7A:
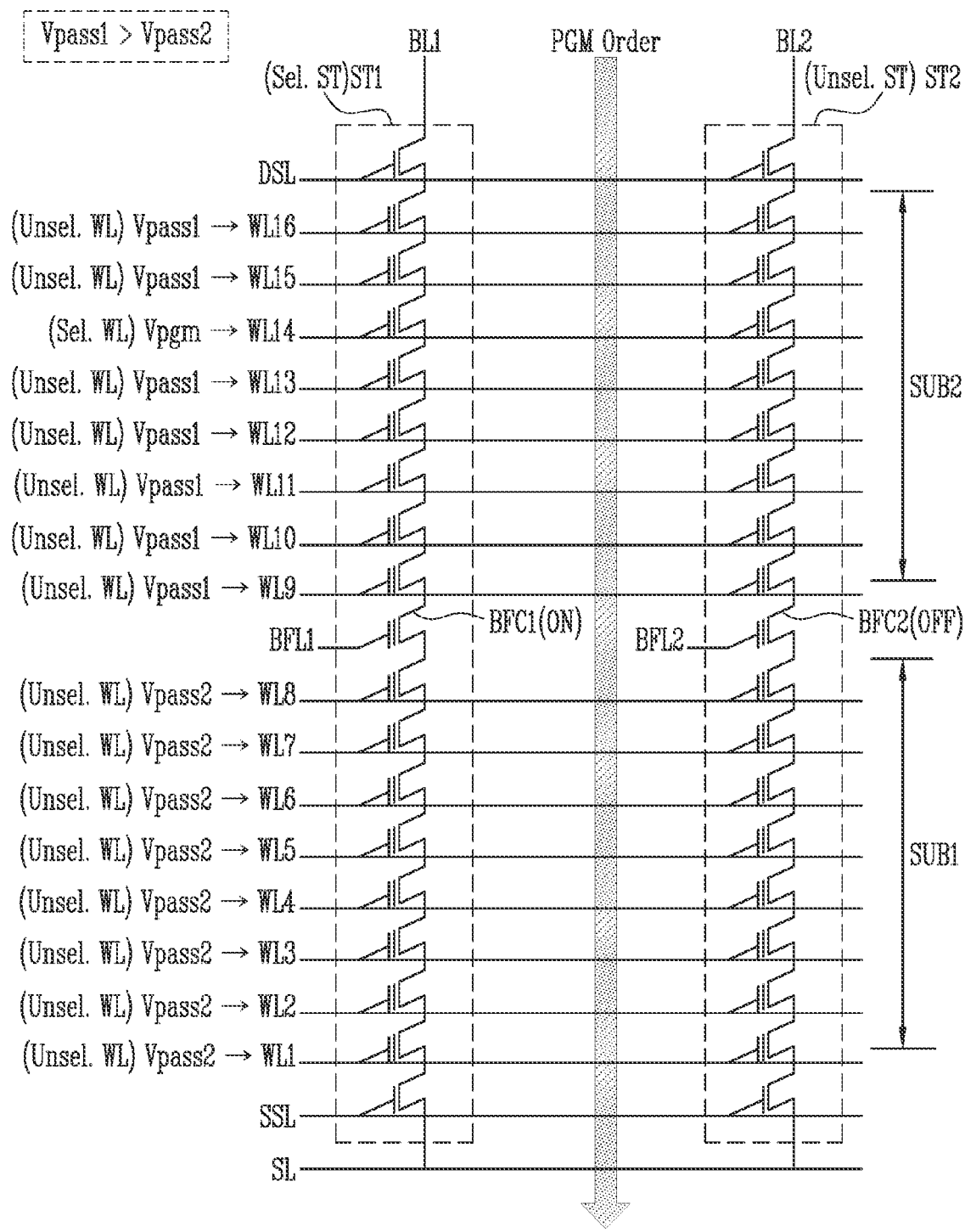
FIGS. 7A and 7B are diagrams illustrating a program operation in accordance with a first embodiment of the present disclosure.
Figure 7B:
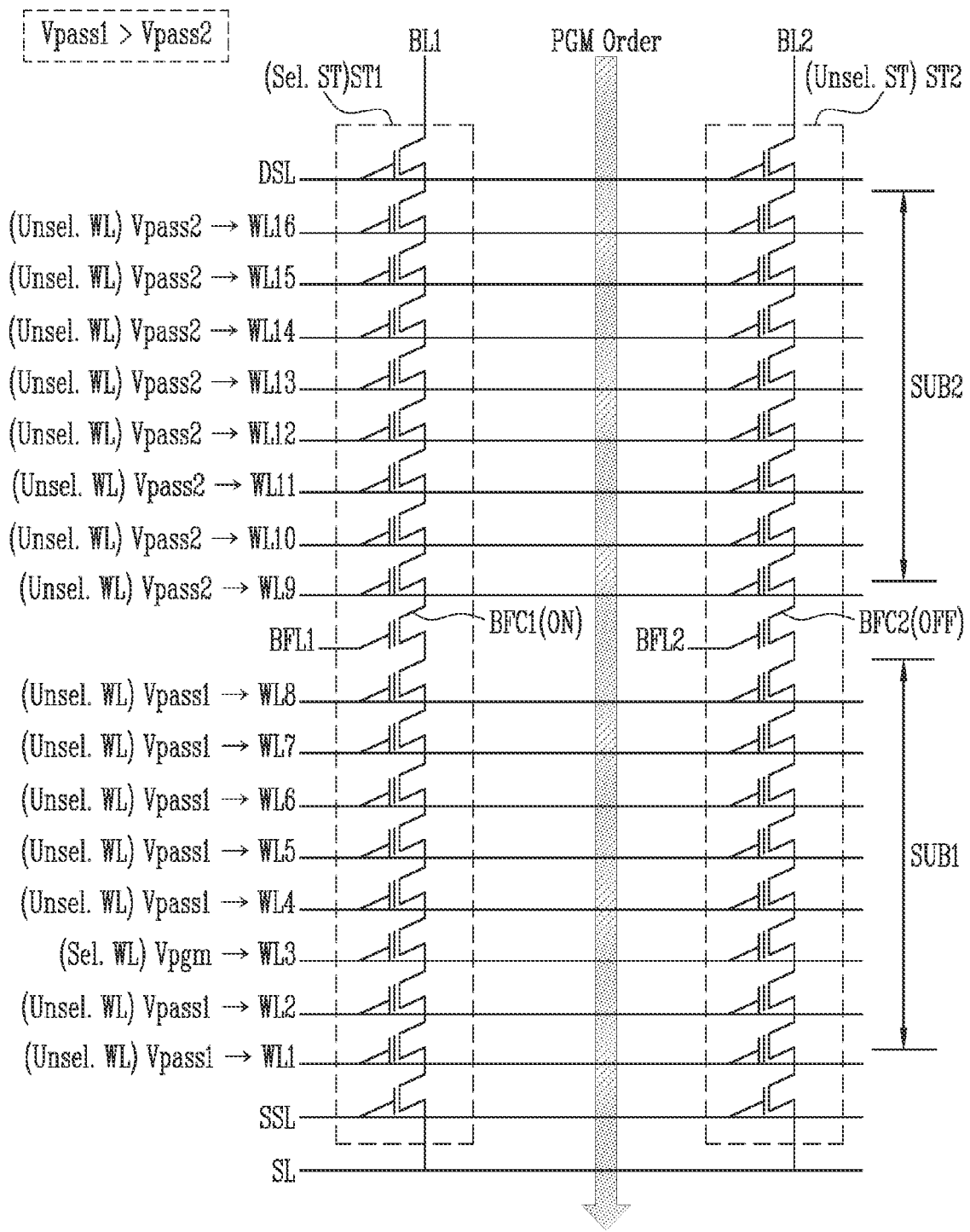

FIGS. 7A and 7B are diagrams illustrating a program operation in accordance with a first embodiment of the present disclosure.

Referring to FIG. 7A, when assuming that a program operation is performed in a direction from the drain select line DSL to the source select line SSL, the program operation may be performed while the sixteenth to ninth word lines WL16 to WL9 connected to the second sub-block SUB2 are sequentially selected. Therefore, when a selected word line Sel. WL is included in the second sub-block SUB2, a first pass voltage Vpass1 may be applied to unselected word lines Unsel. WL connected to the second sub-block SUB2, and a second pass voltage Vpass2 lower than the first pass voltage Vpass1 may be applied to unselected word lines Unsel. WL connected to the first sub-block SUB1 in which the selected word line Sel. WL is not included. Because a program voltage Vpgm is applied to the selected word line Sel. WL, the first pass voltage Vpass1 having a high level is applied to the unselected word lines Unsel. WL of the second sub-block SUB2 so as to highly maintain a channel voltage of an unselected string Unsel, ST included in the second sub-block SUB2.

A turn-on voltage may be applied to the first buffer line BFL1 and a turn-off voltage may be applied to the second buffer line BFL2 such that the first buffer cell BFC1 included in a selected string Sel. ST is turned on and the second buffer cell BFC2 included in the unselected string Unsel. ST is turned off.

That is, because the second pass voltage Vpass2 lower than the first pass voltage Vpass1 is applied to unselected word lines Unsel. WL connected to the selected string Sel. ST, a channel voltage of the unselected string Unsel. ST included in the first sub-block SUB1 is maintained, and a phenomenon can be prevented in which a threshold voltage of memory cells included in the selected string Sel. ST is increased by the channel voltage.

Referring to FIG. 7B, when a program operation of memory cells connected to the sixteenth to ninth word lines WL16 to WL9 is completed, a program operation on the first sub-block SUB1 is performed. While memory cells connected to the eighth to first word lines WL8 to WL1 included in the first sub-block SUB1 are being programmed, the first pass voltage Vpass1 is applied to the unselected word lines Unsel. WL connected to a first sub-block SUB1, and the second pass voltage Vpass2 lower than the first pass voltage Vpass1 is applied to the unselected word lines Unsel. WL connected to the second sub-block SUB2.

Figure 8A:
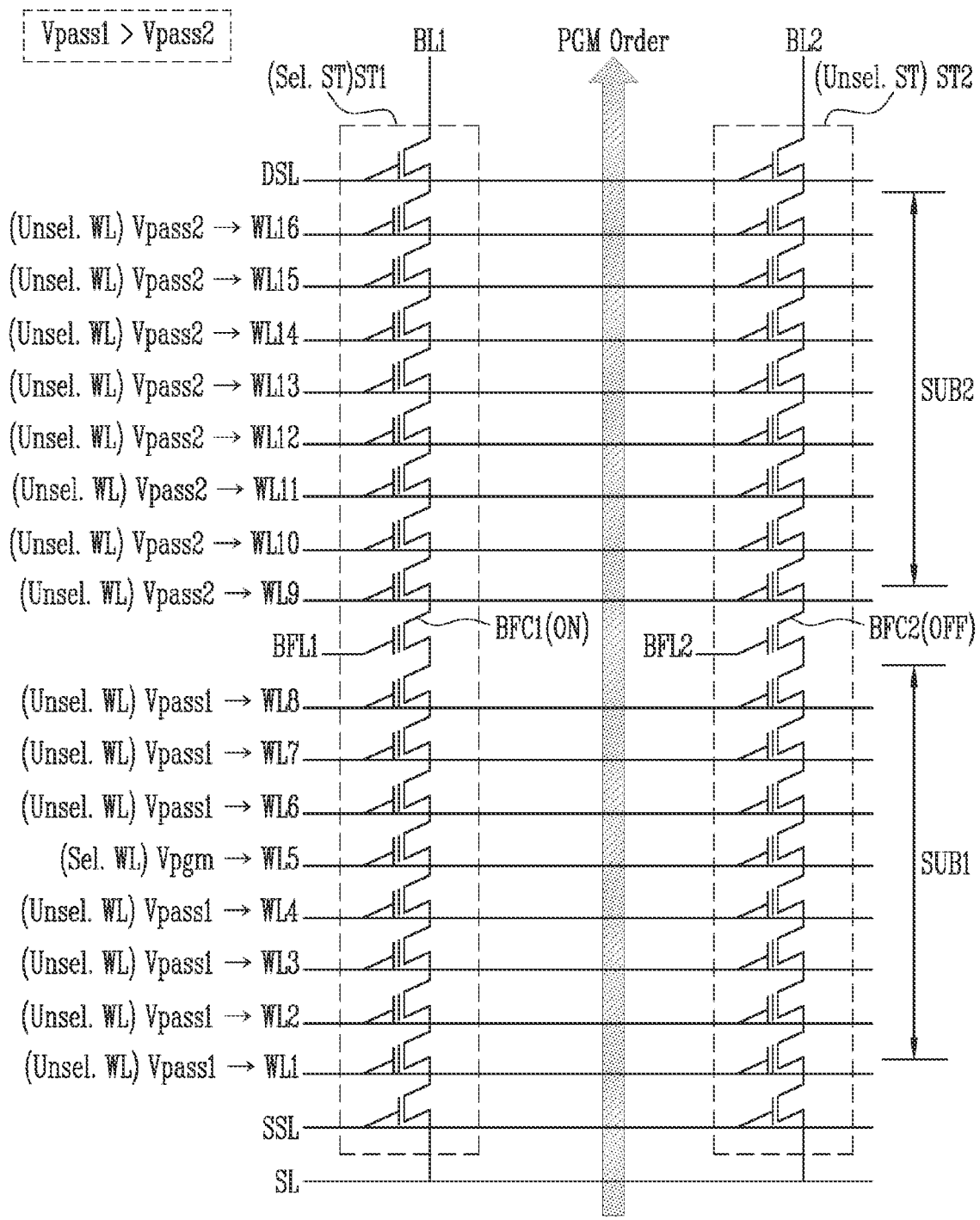
FIGS. 8A and 8B are diagrams illustrating a program operation in accordance with a second embodiment of the present disclosure.
Figure 8B:
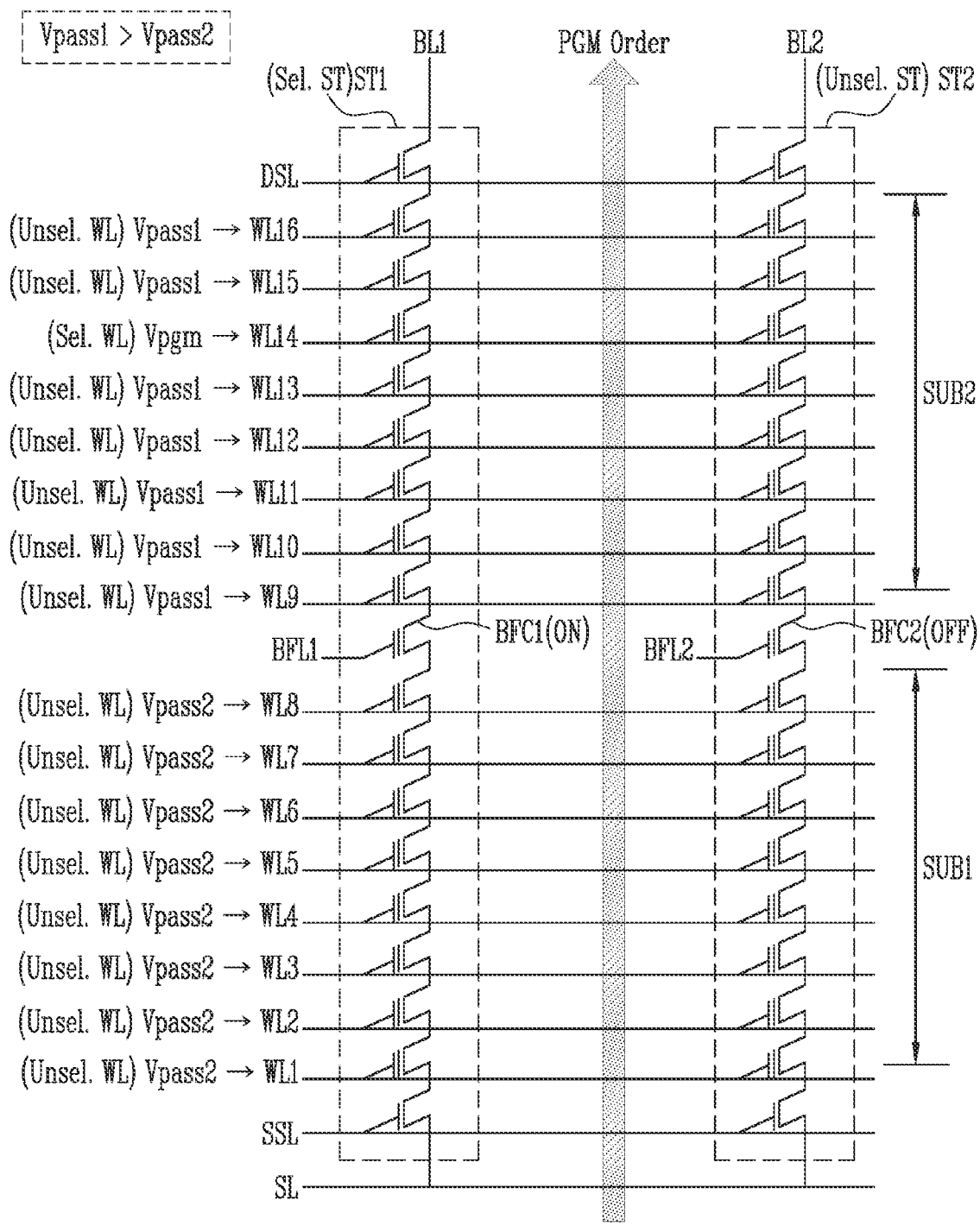

FIGS. 8A and 8B are diagrams illustrating a program operation in accordance with a second embodiment of the present disclosure.

Referring to FIG. 8A, unlike the first embodiment, a program operation may be performed in a direction from the first word line WL1 to the sixteenth word line WL16. The first buffer cell BFC1 included in a selected string Sel. ST is turned on, and the second buffer cell BFC2 included in an unselected string Unsel. ST is turned off.

In the second embodiment, memory cells are programmed from memory cells included in the first sub-block SUB1. Therefore, when a program voltage Vpgm is applied to a selected word line Sel. WL connected to the first sub-block SUB1, a first pass voltage Vpass1 may be applied to unselected word lines Unsel. WL connected to the first sub-block SUB1, and a second pass voltage Vpass2 lower than the first pass voltage Vpass1 may be applied to unselected word lines Unsel. WL connected to the second sub-block SUB2.

Therefore, a threshold voltage of memory cells is not increased due to channel boosting in the unselected string Unsel. ST, and a threshold voltage of memory cells included in the selected string Sel. ST among memory cells included in the second sub-block SUB is not increased by the second pass voltage Vpass2.

Referring to FIG. 8B, when a selected word line Sel. WL is included in the second sub-block SUB2, the second pass voltage Vpass2 lower than the first pass voltage Vpass1 may be applied to the unselected word lines Unsel. WL connected to the first sub-block SUB1 on which a program operation is performed, and the first pass voltage Vpass1 may be applied to the unselected word lines Unsel. WL connected to the second sub-block SUB2. Although the sub-block in which the selected word line Sel. WL is included is changed, the second buffer cell BFC2 included in the unselected string Unsel. ST may maintain a turn-off state.

Figure 9:
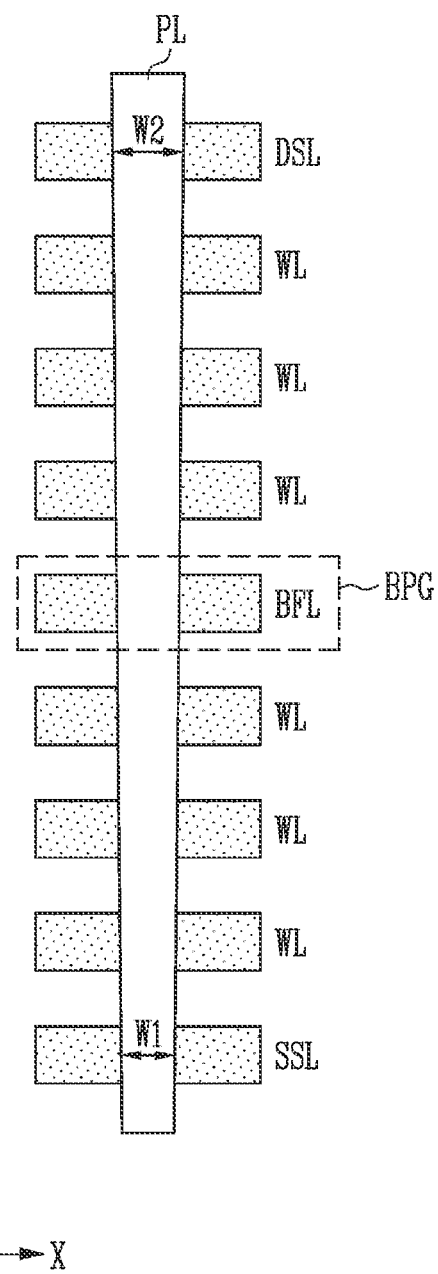
FIG. 9 is a diagram illustrating a method for setting a position of a buffer page.

FIG. 9 is a diagram illustrating a method for setting a position of a buffer page.

Referring to FIG. 9, a position of a buffer page BPG including buffer cells may be set according to a physical structure or electrical characteristic of memory cells included in strings. When a memory block is formed in a three-dimensional structure, a string included in the memory block may be formed in a vertical direction Z above a substrate.

When the memory block is manufactured, a difference between a lower width W1 and an upper width W2 of a pillar PL vertically penetrating word lines WL may occur. Therefore, the width of the pillar PL including a channel layer, a memory layer, and the like may be changed depending on a height or depth. When a difference in width of the pillar occurs, a difference between widths of memory cells connected to each word line WL occurs, and therefore, electrical characteristics of the memory cells may be different from each other depending on positions of the memory cells. The positions of the memory cells may correspond to physical structures of the memory cells. Alternatively, according to a manufacturing method of the memory block, a difference in width of the pillar PL of the string may occur in a boundary layer of a stacked structure. For example, an electrical characteristic of memory cells having a relatively narrow width may be considerably influenced by a peripheral voltage, and therefore, the position of the page buffer BPG may be set such that program disturb caused by a pass voltage does not occur. Such a difference in physical structure may be changed for each die, each plane, or each memory block, and therefore, the position of the buffer page BPG may be set according to a configuration of the die, the plane, or the memory block.

Figure 10A:
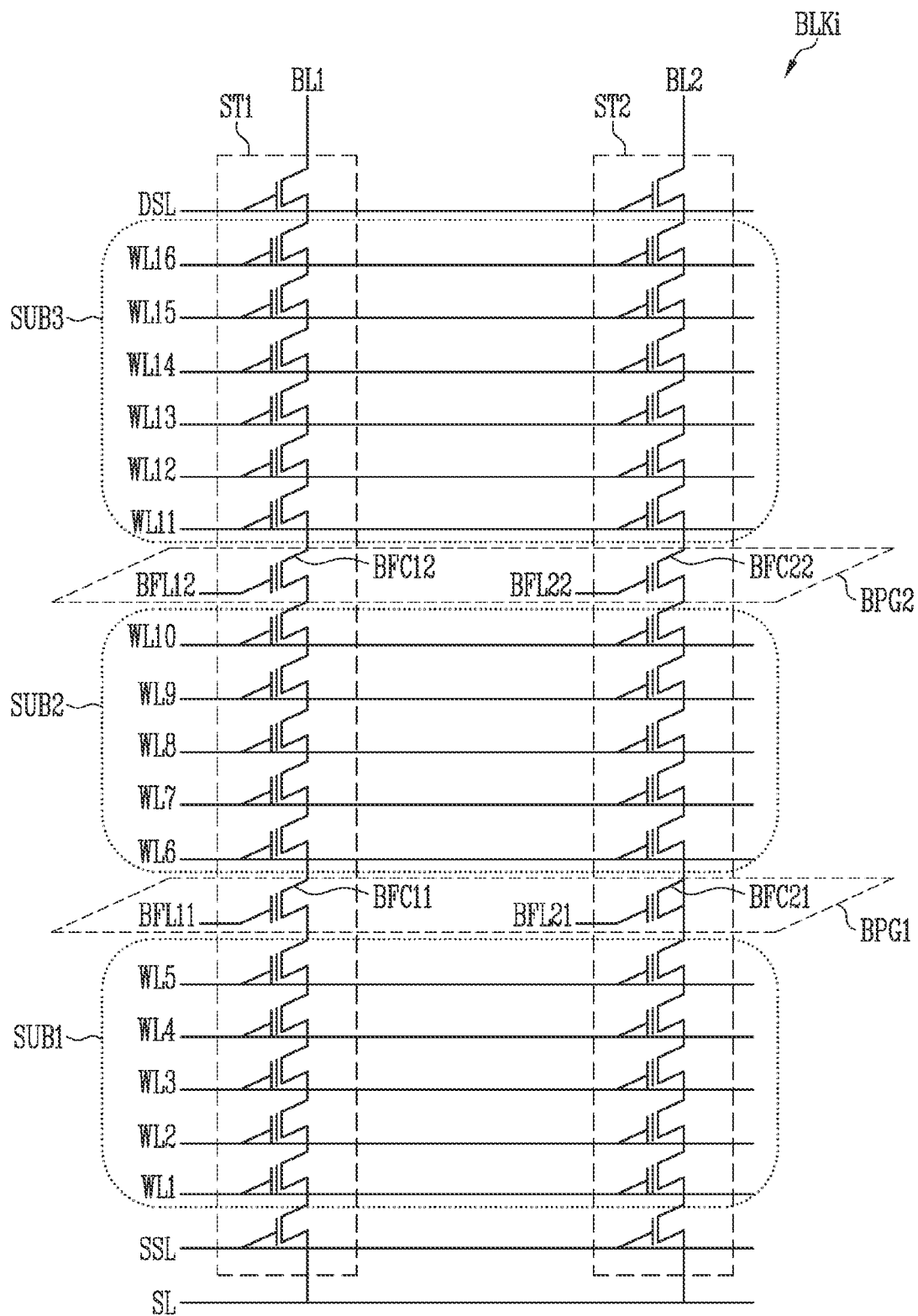
FIGS. 10A and 10B are diagrams illustrating a structure of strings and a program operation in accordance with a third embodiment of the present disclosure.
Figure 10B:
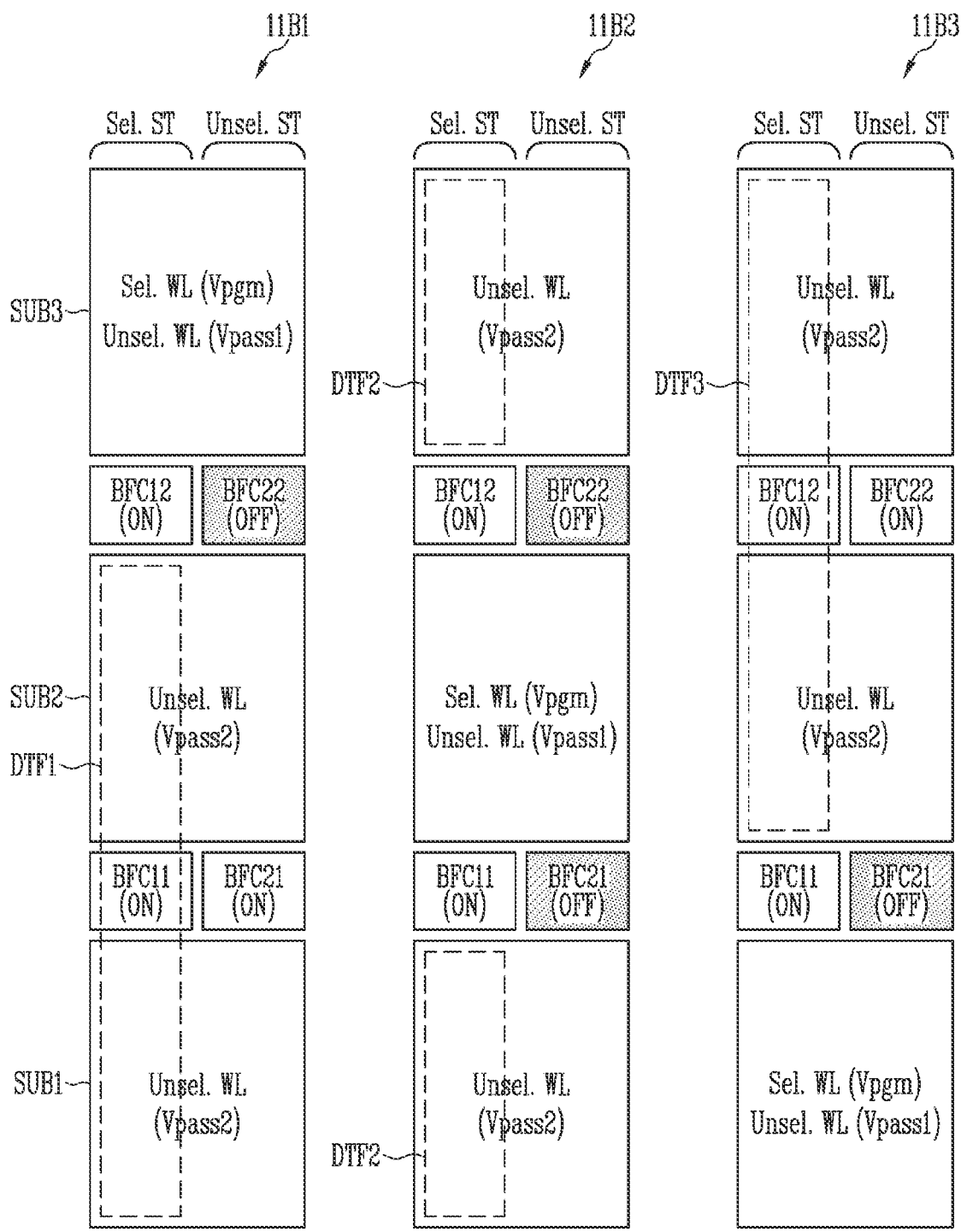

FIGS. 10A and 10B are diagrams illustrating a structure of strings and a program operation in accordance with a third embodiment of the present disclosure.

Referring to FIG. 10A, a plurality of buffer pages BPG1 and BPG2 may be included in an ith memory block BLKi. First and second buffer pages BPG1 and BPG2 may be included at different positions in one memory block. The first and second buffer pages BPG1 and BPG2 may respectively include a plurality of buffer cells BFC11, BFC12, BFC21, and BFC22 included in different strings. For example, the first buffer page BPG1 may be located between the fifth and sixth word lines WL5 and WL6, and the second buffer page BPG2 may be located between the tenth and eleventh word lines WL10 and WL11. FIG. 10A is a diagram illustrating the third embodiment, and therefore, the positions of the first and second buffer pages BPG1 and BPG2 are not limited to those shown in the drawing.

The first buffer page BPG1 may include an eleventh buffer cell BFC11 included in the first string ST1 and a twenty-first buffer cell BFC21 included in the second string ST2, and the second buffer page BPG2 may include a twelfth buffer cell BFC12 included in the first string ST1 and a twenty-second buffer cell BFC22 included in the second string ST2. The eleventh, twelfth, twenty-first, and twenty-second buffer cells BFC11, BFC12, BFC21, and BFC22 may operate in response to different turn-on or turn-off voltages. For example, gates of the eleventh, twelfth, twenty-first, and twenty-second buffer cells BFC11, BFC12, BFC21, and BFC22 may be connected to different eleventh, twelfth, twenty-first, and twenty-second buffer lines BFL11, BFL12, BFL21, and BFL22.

When a plurality of buffer cells are included in one string, the buffer cells are turned on or turned off according to a position of a selected word line in a program operation. A turn-on voltage and a turn-off voltage, which are applied to the eleventh, twelfth, twenty-first, and twenty-second buffer lines BFL11, BFL12, BFL21, and BFL22, may be output by the buffer line circuit (140 shown in FIG. 1). When one of sub-blocks SUB1 to SUB3, in which a selected word line Sel. WL is included, is changed, a control method of buffer cells and a pass voltage will be described in detail as follows.

Referring to FIG. 10B, in a program operation, when the selected word line Sel. WL is included in a third sub-block SUB3 (11B1), the eleventh and twelfth buffer cells BFC11 and BFC12 included in a selected string Sel. ST and the twenty-first buffer cell BFC21 included in an unselected string Unsel. ST are turned on, and the twenty-second buffer cell BFC22 which is included in the unselected string Unsel. ST and is adjacent to the third sub-block SUB3 to which the selected word line Sel. WL is connected is turned off. When a program voltage Vpgm is applied to the selected word line Sel. WL, a first pass voltage Vpass1 may be applied to unselected word lines Unsel. WL of the third sub-block SUB3. A second pass voltage Vpass2 lower than the first pass voltage Vpass1 may be applied to unselected word lines Unsel. WL connected to first and second sub-blocks SUB1 and SUB2 in which the selected word line Sel. WL is not included. Accordingly, program disturb can be suppressed in memory cells DTF1 included in the first and second sub-blocks SUB1 and SUB2 of the selected string Sel. ST.

In a program operation, when a selected word line Sel. WL is included in the second sub-block SUB2 (11B2), the eleventh and twelfth buffer cells BFC11 and BFC12 included in the selected string Sel. ST are turned on, and the twenty-first and twenty-second buffer cells BFC21 and BFC22 which are included in the unselected string Unsel. ST and are adjacent to the second sub-block SUB2 to which the selected word line Sel. WL is connected are turned off. When a program voltage Vpgm is applied to the selected word line Sel. WL, a first pass voltage Vpass1 may be applied to unselected word lines Unsel. WL of the second sub-block SUB2. A second pass voltage Vpass2 lower than the first pass voltage Vpass1 may be applied to unselected word lines Unsel. WL connected to the first and third sub-blocks SUB1 and SUB3 in which the selected word line Sel. WL is not included. Accordingly, program disturb can be suppressed in memory cells DTF2 included in the first and third sub-blocks SUB1 and SUB3 of the selected string Sel. ST.

In a program operation, when a selected word line Sel. WL is included in the first sub-block SUB1 (11B3), the eleventh and twelfth buffer cells BFC11 and BFC12 included in the selected string Sel. ST are turned on, and the twenty-first and twenty-second buffer cells BFC21 and BFC22 which are included in the unselected string Unsel. ST and are adjacent to the first sub-block SUB1 to which the selected word line Sel. WL is connected are turned off. When a program voltage Vpgm is applied to the selected word line Sel. WL, a first pass voltage Vpass1 may be applied to unselected word lines Unsel. WL of the first sub-block SUB1. A second pass voltage Vpass2 lower than the first pass voltage Vpass1 may be applied to unselected word lines Unsel. WL connected to the second and third sub-blocks SUB2 and SUB3 in which the selected word line Sel. WL is not included. Accordingly, program disturb can be suppressed in memory cells DTF3 included in the second and third sub-blocks SUB2 and SUB3 of the selected string Sel. ST.

Although a case where the first or second pass voltage Vpass1 or Vpass2 is applied to the sub-blocks has been described in FIG. 103, the voltage generator (120 shown in FIG. 1) may apply different pass voltages, in addition to the first or second pass voltage Vpass1 or Vpass2, to unselected word lines of an unselected sub-block.

Figure 11:
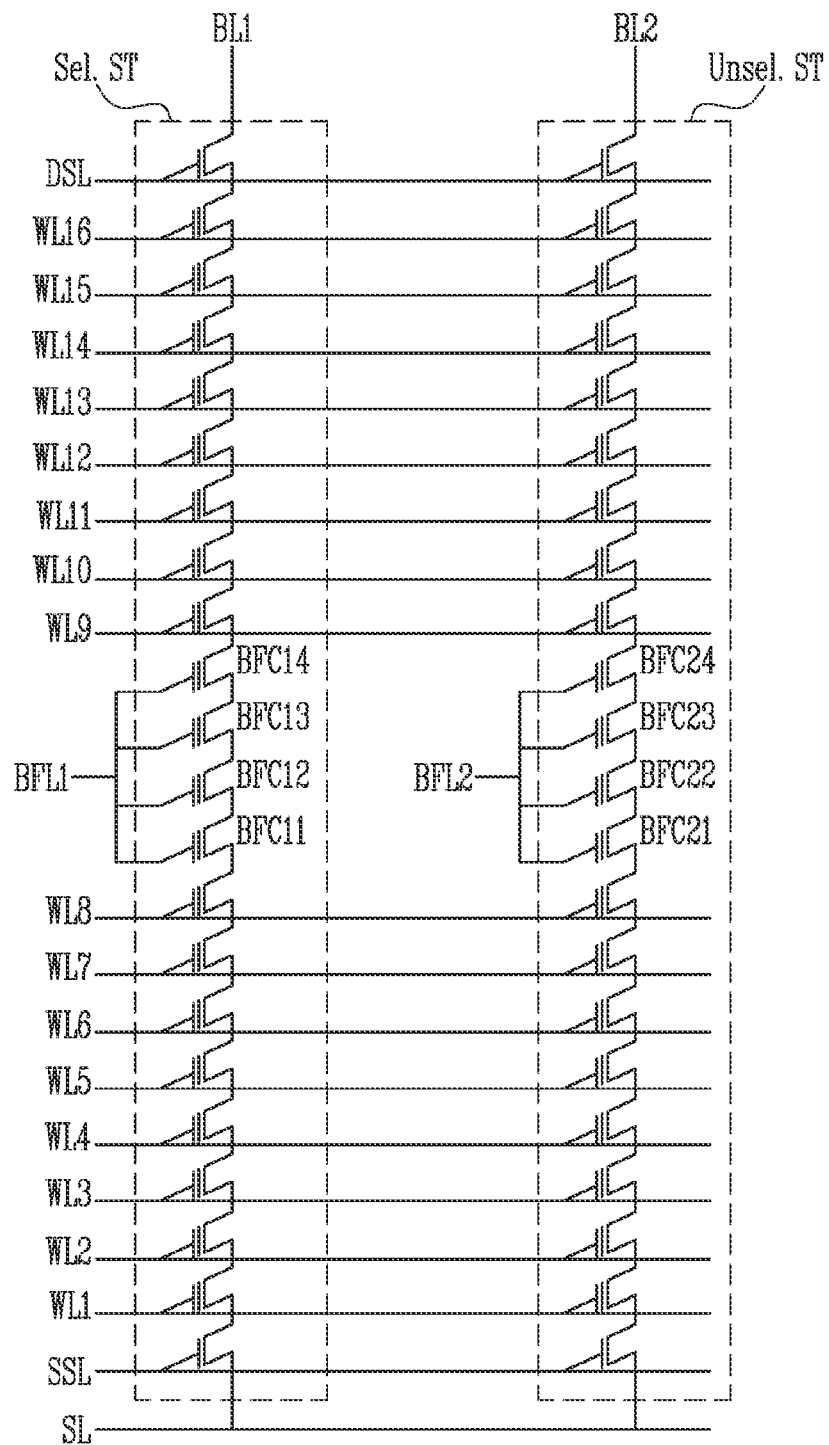
FIG. 11 is a diagram illustrating a structure of strings and a program operation in accordance with a fourth embodiment of the present disclosure.

FIG. 11 is a diagram illustrating a structure of strings and a program operation in accordance with a fourth embodiment of the present disclosure.

Referring to FIG. 11, two or more buffer cells may be connected adjacent to each other in each of strings. Eleventh to fourteenth buffer cells BFC11 to BFC14 may be arranged adjacent to each other between memory cells of a selected string Sel. ST, and twenty-first to twenty-fourth buffer cells BFC21 to BFC24 may be arranged adjacent to each other between memory cells of an unselected string Unsel. ST. For example, the eleventh to fourteenth buffer cells BFC11 to BFC14 and the twenty-first to twenty-fourth buffer cells BFC21 to BFC24 may be connected between memory cells connected to the eighth and ninth word lines WL8 and WL9. As described above, in a structure in which a plurality of buffer cells are consecutively connected to each other, leakage through a channel can be effectively prevented when the buffer cells are turned off.

Gates of the eleventh to fourteenth buffer cells BFC11 to BFC14 may be commonly connected to a first buffer line BFL1, and gates of the twenty-first to twenty-fourth buffer cells BFC21 to BFC24 may be commonly connected to a second buffer line BFL2.

TABLE 1

| Sel. ST | | Unsel. ST | |
|---|---|---|---|
| BFC14 | ON | BFC24 | OFF |
| BFC13 | ON | BFC23 | OFF |
| BFC12 | ON | BFC22 | OFF |
| BFC11 | ON | BFC21 | OFF |

A case where a string including the eleventh to fourteenth buffer cells BFC11 to BFC14 is the selected string Sel. ST and a string including the twenty-first to twenty-fourth buffer cells BFC21 to BFC24 is the unselected string Unsel. ST is assumed. Referring to 'Table 1,' when a turn-on voltage is applied to the first buffer line BFL1 in a program operation, the eleventh to fourteenth buffer cells BFC11 to BFC14 may be simultaneously turned on (ON). When a turn-off voltage is applied to the second buffer line BFL2, the twenty-first to twenty-fourth buffer cells BFC21 to BFC24 may be simultaneously turned off (OFF). As described above, when a plurality of buffer cells connected to each other are simultaneously turned off, the length of a disconnected channel increases, and thus occurrence of leakage in a corresponding string can be prevented. Accordingly, although different pass voltages are applied to unselected word lines of sub-blocks, channel voltages of unselected strings do not changed.

Figure 12A:
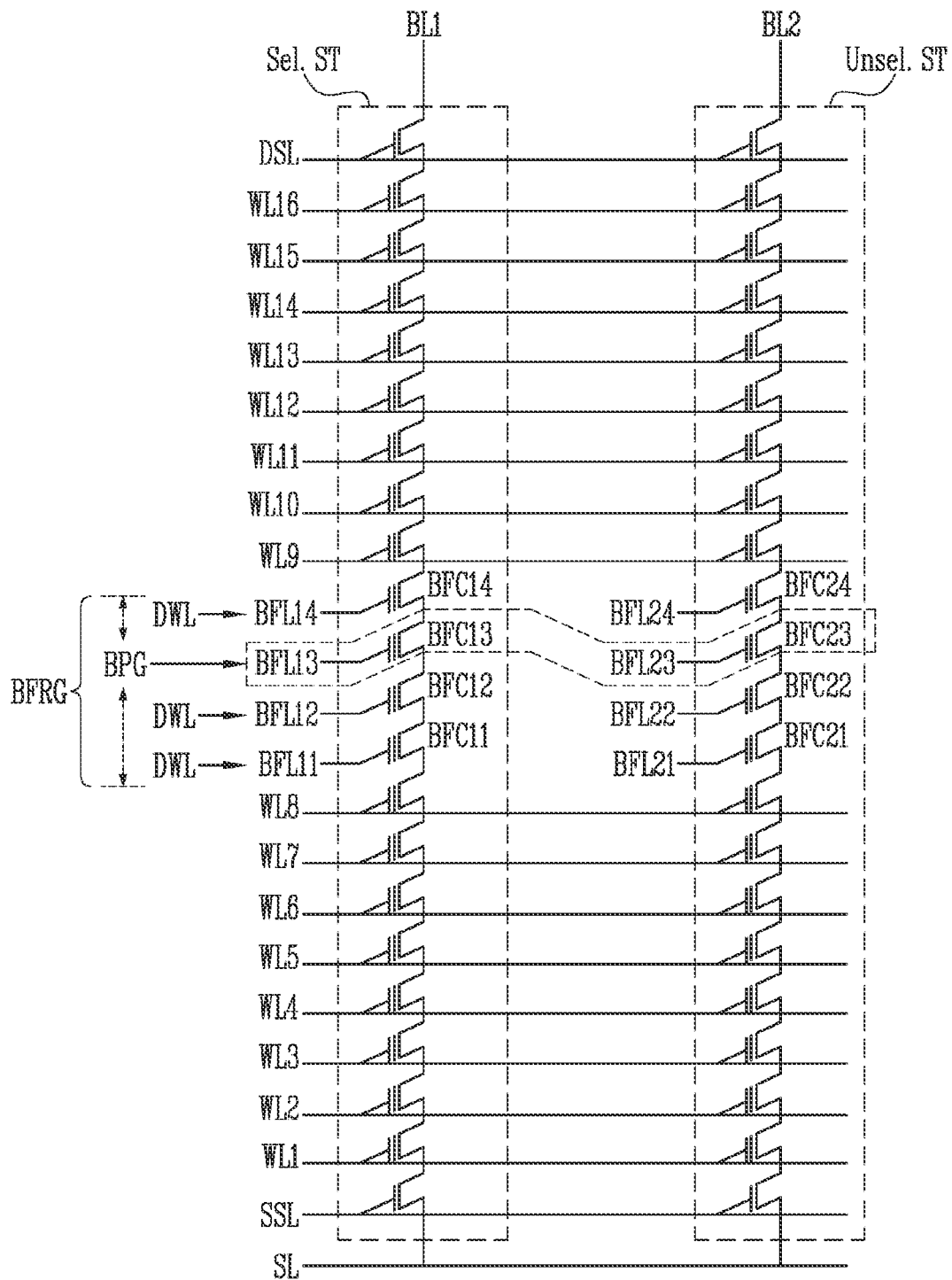
FIGS. 12A and 12B are diagram illustrating a structure of strings in accordance with a fifth embodiment of the present disclosure.
Figure 12B:
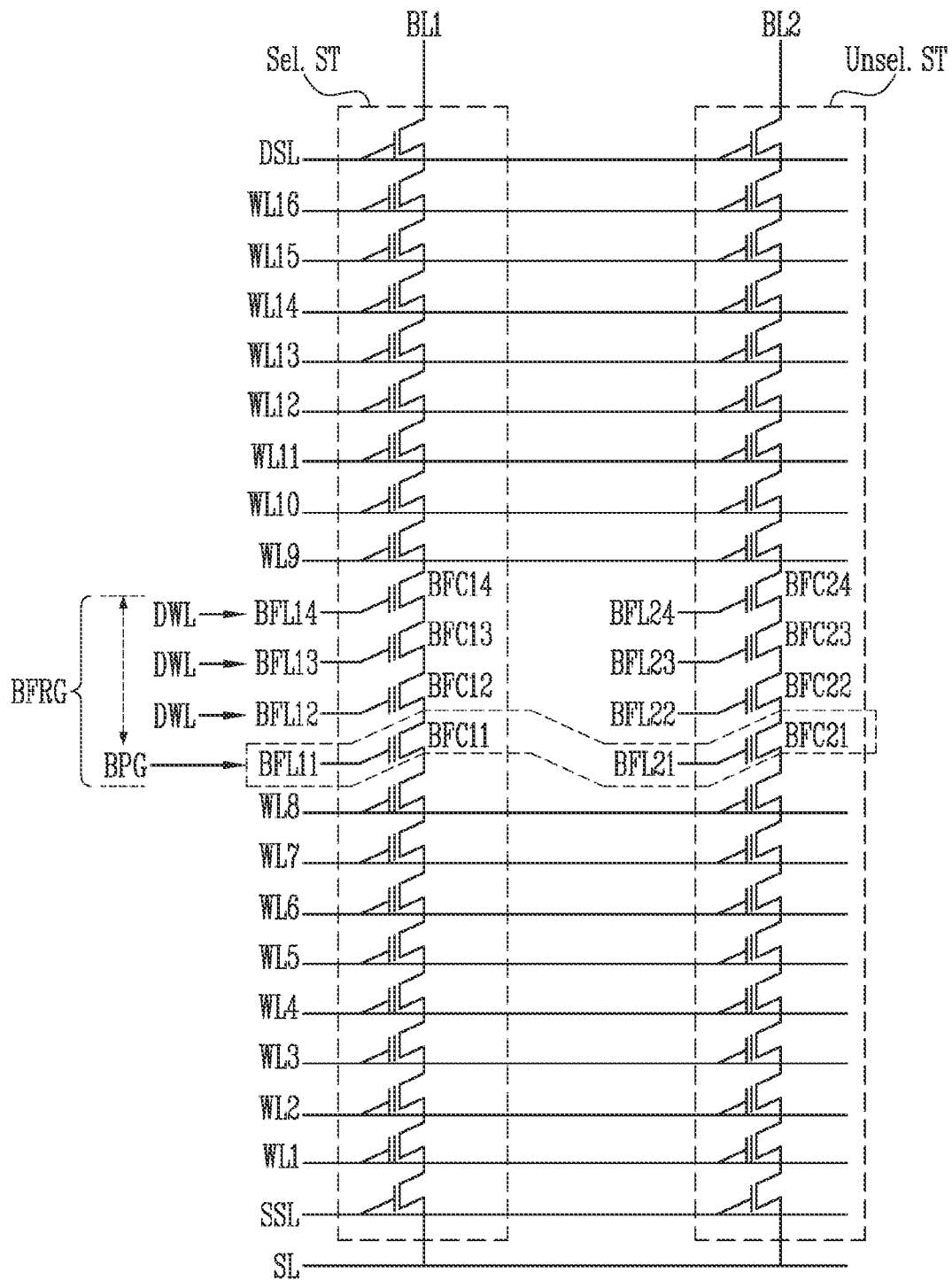

FIGS. 12A and 12B are diagram illustrating a structure of strings in accordance with a fifth embodiment of the present disclosure.

Referring to FIG. 12A, when a plurality of buffer cells are included in a string, gates of buffer cells may be separated from each other, and operate in response to different turn-on or turn-off voltages. Any one cell among buffer cells included in the same string may be used as a buff cell, and the other cells may be used as dummy cells. For example, there is assumed a case where eleventh to fourteenth buffer cells BFC11 to BFC14 are connected between the eighth and ninth word lines WL8 and WL9 in a string connected to the first bit line BL1, and twenty-first to twenty-fourth buffer cells BFC21 to BFC24 are connected between the eighth and ninth word lines WL8 and WL9 in a string connected to the second bit line BL2, Among these buffer cells, the thirteenth and twenty-third buffer cells BFC13 and BFC23 may be used as buffer cells, and the other buffer cells BFC11, BFC12, BFC14, BFC21, BFC22, and BFC24 may be used as dummy cells.

A page in which the thirteenth and twenty-third buffer cells BFC13 and BFC23 are included may be a default page initially set when the memory device is manufactured. For example, according to a physical structure of strings when the memory device is manufactured, the page in which the thirteenth and twenty-third buffer cells BFC13 and BFC23 are included may be set as a buffer page BPG, and a default address corresponding to the buffer page BPG may be stored in the memory device. The default address may be stored in the control logic (180 shown in FIG. 1), but the present disclosure is not limited thereto.

A page in which the other buffer cells except the buffer page BPG are included may be used as a dummy page. For example, the eleventh and twenty-first buffer cells BFC11 and BFC21 may be used as dummy cells, and gates of the dummy cells may be used as may be used as dummy word lines DWL. Therefore, the other buffer cells BFC12, BFC 22, BFC 14, and BFC 24 except the twenty-third buffer cell BFC23 may be used as dummy cells in the string connected to the second bit line BL2, Gates of the buffer cells BFC12, BFC 22, BFC 14, and BFC 24 used as the dummy cells may be used as dummy word lines DWL. The dummy cells mean cells which do not store valid data and the dummy word lines DWL mean word lines connected to the gates of the dummy cells.

TABLE 2

| Sel. ST | | Unsel. ST | |
|---|---|---|---|
| BFC14 | ON | BFC24 | ON or OFF |
| BFC13 | ON | BFC23 | OFF |
| BFC12 | ON | BFC22 | ON or OFF |
| BFC11 | ON | BFC21 | ON or OFF |

Referring to 'Table 2,' the thirteenth buffer cell BFC13 as a buffer cell and the eleventh, twelfth, and fourteenth buffer cells BFC11, BFC12, and BFC14 used as dummy cells among the eleventh to fourteenth buffer cells BFC11 to BFC14 included in the selected string Sel. ST may be turned on (ON) in a program operation, the twenty-third buffer cell BFC23 used as a buffer cell among the twenty-first to twenty-fourth buffer cells BFC21 to BFC24 included in the unselected string Unsel. ST may be turned off (OFF) in the program operation, and the twenty-first, twenty-second and twenty-fourth buffer cells BFC21, BFC22, and BFC24 used as the other dummy cells among the twenty-first to twenty-fourth buffer cells BFC21 to BFC24 included in the unselected string Unsel. ST may be turned on or turned off (ON or OFF) in the program operation.

An address of the buffer page BPG is set as a default address when the memory device is manufactured, but may be reset according to an electrical characteristic of memory cells while the memory device is being used. The buffer page BPG may be reset in a buffer region BFRG in which the buffer cells BFC11 to BFC14 and BFC21 to BFC24 are included.

When the address of the buffer page BPG in which the thirteenth and twenty-third buffer cells BFC13 and BFC23 are included is set as the default address, the electrical characteristic of memory cells may be changed as a number of time program and erase operations of the memory cells are performed increases. For example, a region in which program disturb occurs may be changed, and the address of the buffer page BPG may be changed. A case where the address of the buffer page BPG is changed will be described with reference to FIG. 12B.

Referring to FIG. 12B, when a position of the buffer page BPG is changed, the use of buffer cells included in a previous buffer page may be changed to that of dummy cells, and gates of the cells changed as the dummy cells become dummy word lines DWL. For example, when the eleventh and twenty-first buffer cells BFC11 and BFC21 are set as new buffer cells, the other twelfth to fourteenth and twenty-second to twenty-fourth buffer cells BFC12 to BFC14 and BFC22 to BFC24 may be used as dummy cells, and gates of the dummy cells may be used as dummy word lines DWL.

TABLE 3

| Sel. ST | | Unsel. ST | |
| --- | --- | --- | --- |
| BFC14 | ON | BFC24 | ON or OFF |
| BFC13 | ON | BFC23 | ON or OFF |
| BFC12 | ON | BFC22 | ON or OFF |
| BFC11 | ON | BFC21 | OFF |

Referring to 'Table 3,' when the address of the buffer page BPG is changed, the twenty-first buffer cell BFC21 connected to the unselected string Unsel. ST may be turned off (OFF) in a program operation, and the twenty-second to twenty-fourth buffer cells BFC22 to BFC24 may be turned on or turned off (ON or OFF) in the program operation. The eleventh to fourteenth buffer cells BFC11 to BFC14 included in the selected string Sel. ST may all be turned on (ON) in the program operation.

Figure 13:
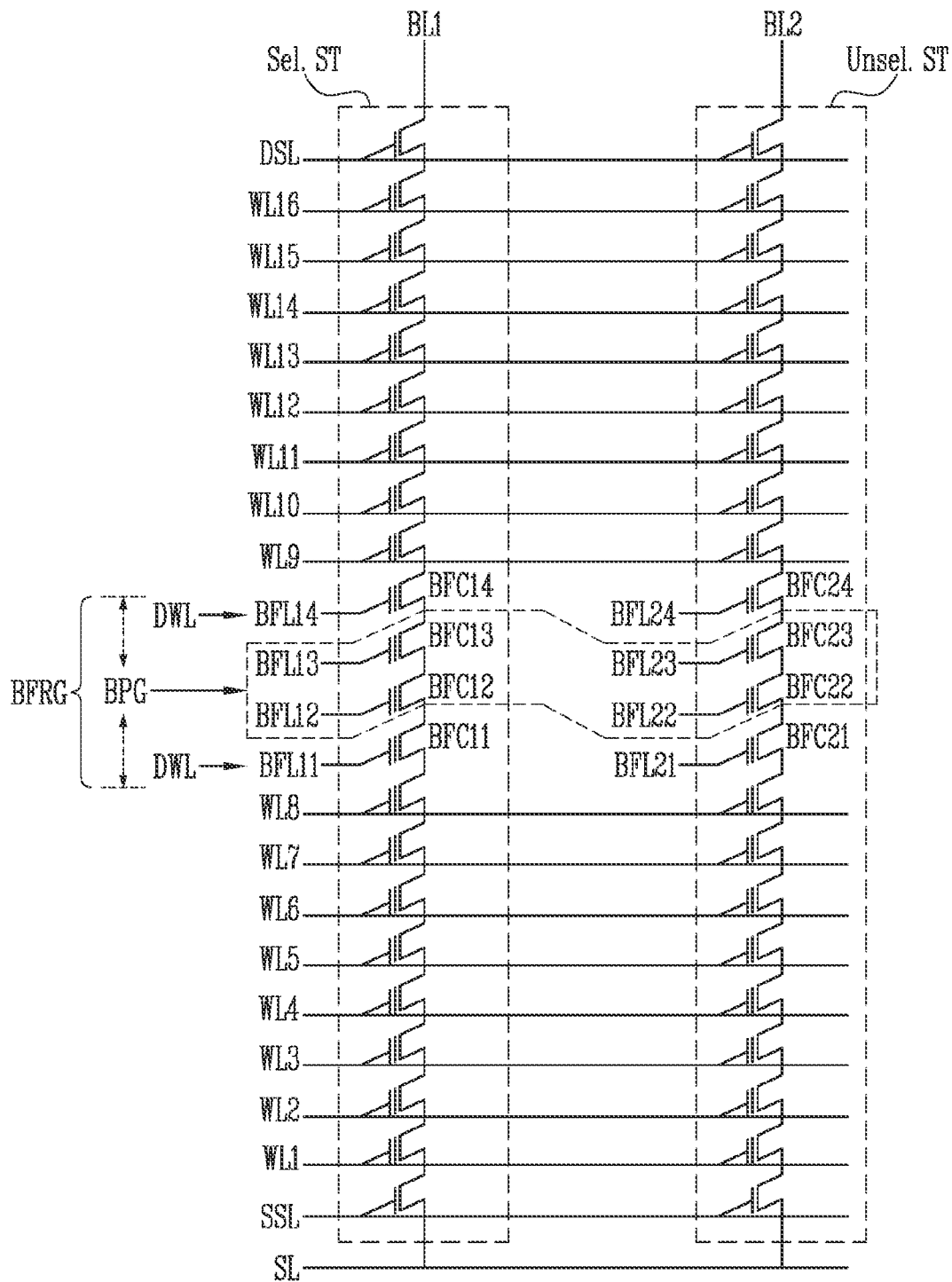
FIG. 13 is a diagram illustrating a structure of strings in accordance with a sixth embodiment of the present disclosure.

FIG. 13 is a diagram illustrating a structure of strings in accordance with a sixth embodiment of the present disclosure.

Referring to FIG. 13, a plurality of pages may be set as a buffer page BPG in the buffer region BFRG. When the plurality of pages are set as the buffer page BPG, the length of a disconnected channel in the unselected string Unsel. ST increases, and thus occurrence of leakage can be further effectively prevented,

TABLE 4

| Sel. ST | | Unsel. ST | |
| --- | --- | --- | --- |
| BFC14 | ON | BFC24 | ON or OFF |
| BFC13 | ON | BFC23 | OFF |

TABLE 4-continued

| Sel. ST | | Unsel. ST | |
| --- | --- | --- | --- |
| BFC12 | ON | BFC22 | OFF |
| BFC11 | ON | BFC21 | ON or OFF |

Referring to 'Table 4,' the eleventh to fourteenth buffer cells BFC11 to BFC14 included in the selected string Sel. ST may all be turned on (ON) in a program operation. The twenty-second and twenty-third buffer cells BFC22 and BFC23 used as buffer cells in the unselected string Unsel. ST may be turned off (OFF) in the program operation, and the twenty-first and twenty-fourth buffer cells BFC21 and BFC24 used as the other dummy cells may be turned on or turned off (ON or OFF) in the program operation.

The number of pages included in the buffer page BPG may be reset according to a physical structure or electrical characteristic of memory cells in the buffer region BFRG.

Figure 14:
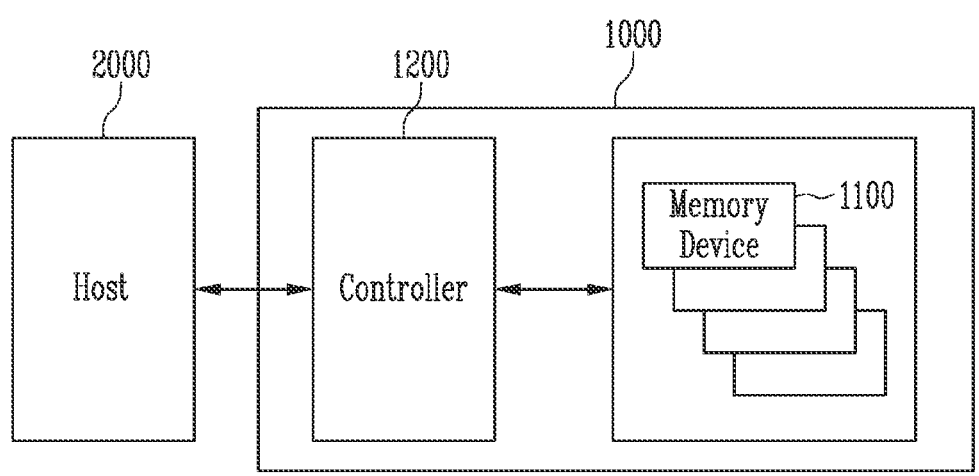
FIG. 14 is a diagram illustrating a memory system including the memory device of the present disclosure.

FIG. 14 is a diagram illustrating a memory system 1000 including the memory device of the present disclosure.

Referring to FIG. 14, the memory system 1000 may include a memory device 1100 configured to store data and a controller 1200 configured to communicate between the memory device 1100 and a host 2000.

A plurality of memory devices 1100 may be included in the memory system 1000, and each of the memory devices 1100 may perform a program operation in accordance with the above-described first to sixth embodiments. The memory devices 1100 may be connected to the controller 1200 through at least one channel. For example, the plurality of memory devices 1100 may be connected to one channel. Even when a plurality of channels are connected to the controller 1200, the plurality of memory devices 1100 may be connected to the respective channels.

The controller 1200 may communicate between the host 2000 and the memory device 1100. The controller 1200 may control the memory device 1100 in response to a request from the host 2000, or perform a background operation for improving the performance of the memory system 1000. The host 2000 may generate requests for various operations, and output the generated requests to the memory system 1000. For example, the requests may include a program request capable of controlling a program operation, a read request capable of controlling a read operation, an erase request capable of controlling an erase operation, and the like.

The host 2000 may communicate with the memory system 1000 through various interfaces such as Peripheral Component Interconnect-Express (PCI-E), Advanced Technology Attachment (ATA), Serial ATA (SATA), Parallel ATA (DATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 15:
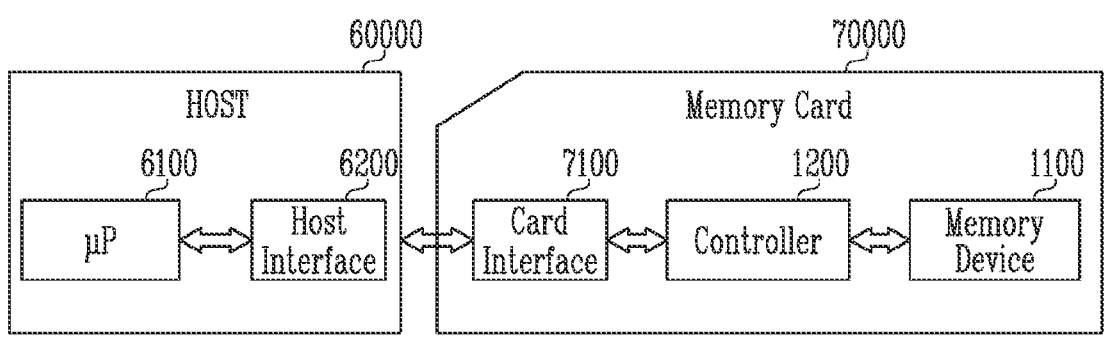
FIG. 15 is a diagram illustrating another memory system including the memory device of the present disclosure.

FIG. 15 is a diagram illustrating another memory system 70000 including the memory device of the present disclosure.

Referring to FIG. 15, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The memory device 1100 may perform a program operation in accordance with the above-described first to sixth embodiments, and data programmed to the memory device 1100 may be output through the card interface 7100 under the control of the controller 1200.

The card interface 7100 may interface data exchange between the host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor (µP) 6100.

In accordance with the present disclosure, a channel voltage of an unselected string is increased in a program operation, so that a program disturb phenomenon, in which a threshold voltage of unselected memory cells is increased, can be suppressed.

What is claimed is:

1. A memory device comprising:
   sub-blocks divided with respect to a buffer page in which buffer cells are included;
   a voltage generator configured to, in a program operation of a selected sub-block among the sub-blocks, apply first pass voltages to unselected word lines connected to the selected sub-block, and apply second pass voltages lower than the first pass voltages to unselected word lines connected to an unselected sub-block; and
   a buffer line circuit configured to selectively turn on or turn off the buffer cells by selectively applying a turn-on voltage or a turn-off voltage to buffer lines connected to the buffer cells,
   wherein a position of the buffer page is set as a default according to a physical structure of memory cells included in the sub-blocks, and is reset according to an electrical characteristic of the memory cells.

2. The memory device of claim 1, wherein the sub-blocks include;
   first sub-blocks including memory cells between a first select transistor and at least a buffer cell among the buffer cells; and
   second sub-blocks including memory cells between a second select transistor and at least a buffer cell among the buffer cells.

3. The memory device of claim 2, wherein the memory cells included in each of the first sub-blocks and the second sub-blocks constitute a plurality of pages divided in a unit of a word line,
   wherein the buffer lines different from each other are connected to the buffer cells.

4. The memory device of claim 2, wherein numbers of memory cells included in different strings in the first or the second sub-blocks are the same.

5. The memory device of claim 4, wherein numbers of memory cells included in the first and second sub-blocks among the different strings are the same or are different from each other according to the physical structure of the memory cells included in the sub-blocks.

6. The memory device of claim 1, wherein the buffer line circuit is configured to output the turn-on voltage such that a buffer cell included in a selected string among the buffer cells is turned on, and configured to output the turn-off voltage such that a buffer cell included in unselected strings among the buffer cells is turned off.

7. The memory device of claim 1, wherein, when a selected word line is included in another sub-block, after a program operation of the selected sub-block is completed, the voltage generator is configured to:
   apply the first pass voltages to unselected word lines connected to a newly selected sub-block; and
   apply the second pass voltages to unselected word lines connected to a newly changed unselected sub-block.

8. The memory device of claim 1, wherein the position of the buffer page:
   is Initially set according to the physical structure of the memory cells; and
   is reset when the electrical characteristic of the memory cells is changed.

9. The memory device of claim 1, wherein, when a plurality of buffer pages are included in one memory block, a plurality of buffer cells included in the plurality of buffer pages operate in response to the turn-on voltage or the turn-off voltage, which is applied from each of the different buffer lines.

10. The memory device of claim 1, wherein, when a number of the sub-blocks increases to three or more, the voltage generator is configured to apply different pass voltages to unselected word lines connected to unselected sub-blocks among the sub-blocks in the program operation.

* * * * *